United States Patent
Lin et al.

(10) Patent No.: US 9,214,476 B1
(45) Date of Patent: Dec. 15, 2015

(54) PIXEL STRUCTURE

(71) Applicant: Au Optronics Corporation, Hsinchu (TW)

(72) Inventors: Yi-Cheng Lin, Changhua County (TW); Yu-Chi Chen, Yilan County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 14/468,353

(22) Filed: Aug. 26, 2014

(30) Foreign Application Priority Data

May 22, 2014 (TW) .............................. 103117939 A

(51) Int. Cl.
H01L 27/12 (2006.01)
H01L 33/38 (2010.01)
H01L 27/32 (2006.01)

(52) U.S. Cl.
CPC .......... *H01L 27/1225* (2013.01); *H01L 27/124* (2013.01); *H01L 27/1255* (2013.01); *H01L 27/326* (2013.01); *H01L 27/3244* (2013.01); *H01L 27/3258* (2013.01); *H01L 27/3262* (2013.01); *H01L 27/3265* (2013.01); *H01L 27/3276* (2013.01); *H01L 33/387* (2013.01)

(58) Field of Classification Search
CPC .............. H01L 27/124; H01L 27/1225; H01L 27/1255; H01L 27/3244; H01L 27/3258; H01L 27/326; H01L 27/3262; H01L 27/3265; H01L 27/3276; H01L 33/387
See application file for complete search history.

(56) References Cited

U.S. PATENT DOCUMENTS

| | | | | |
|---|---|---|---|---|
| 2009/0288865 | A1* | 11/2009 | Sagawa | H01L 27/12 174/260 |
| 2011/0084262 | A1* | 4/2011 | Kondratyuk | H01L 29/78696 257/43 |
| 2011/0260168 | A1* | 10/2011 | Toyota | H01L 29/42384 257/59 |
| 2011/0284852 | A1* | 11/2011 | Kim | H01L 27/1225 257/59 |
| 2015/0187953 | A1* | 7/2015 | Koezuka | H01L 29/7869 257/43 |

FOREIGN PATENT DOCUMENTS

| | | |
|---|---|---|
| CN | 101958401 | 1/2011 |
| TW | 1316763 | 11/2009 |
| TW | 201214714 | 4/2012 |

* cited by examiner

*Primary Examiner* — Erik Kielin
(74) *Attorney, Agent, or Firm* — Jianq Chyun IP Office

(57) ABSTRACT

A pixel structure includes a first conductive layer, a semiconductor layer, an insulating layer, a second conductive layer, a passivation layer, and a first electrode layer. The first conductive layer includes a scan line and a bottom electrode. The semiconductor layer includes a first semiconductor pattern having a first source region, a first drain region, and a first channel region. The insulating layer is disposed on the semiconductor layer. The second conductive layer is disposed on the insulating layer and includes a top electrode, a first gate, a first source, a first drain, and a data line connected with the first source. The bottom electrode and the top electrode overlap to form a capacitor. The passivation layer covers the first and second conductive layers and the semiconductor layer. The first electrode layer is disposed on the passivation layer and provides electrical connection to different layers.

13 Claims, 10 Drawing Sheets

PIXEL STRUCTURE

CROSS-REFERENCE TO RELATED APPLICATION

This application claims the priority benefit of Taiwan application serial no. 103117939, filed on May 22, 2014. The entirety of the above-mentioned patent application is hereby incorporated by reference herein and made a part of this specification.

BACKGROUND OF THE INVENTION

1. Field of the Invention

The invention generally relates to a pixel structure, in particular, to a pixel structure characterized by alignment precision in a photolithography process and improved stability of a pixel capacitor.

2. Description of Related Art

An organic light emitting diode (OLED) panel is a type of self-luminous display device. It has the advantages of a wide viewing angle, low power consumption, a simplified manufacturing process, low production costs, a wide operating temperature range, high response speed, full color display, etc. Due to these advantages, the OLED panel is expected to become the mainstream product for the next generation of flat panel displays. In general, the OLED panel includes a plurality of pixel structures, and each pixel structure further includes a plurality of active devices (for example, thin film transistors) or passive devices (for example, resistors and capacitors), a cathode or an anode electrically connected to the active devices, and an organic light emitting layer disposed between the anode and the cathode.

The active devices of the pixel structure can be manufactured by applying indium-gallium-zinc oxide (IGZO) techniques. IGZO is a type of metal oxide which contains indium, gallium, and zinc and has a carrier mobility that is ten times higher than amorphous silicon (a-Si). Such type of metal oxides can greatly increase the speed of charging or discharging the pixel electrode by the active device, hence achieving fast frame rate and allowing smooth animation playback. Currently, as to the top-gate type pixel structure, the first manufacturing process is to make a translucent semiconductor layer (such as IGZO). However, the presence of such translucent semiconductor layer makes alignment precision in the subsequent photolithography processes difficult.

SUMMARY

Accordingly, the invention is directed to a pixel structure which ensures alignment precision in the photolithography process and improves the stability of the pixel capacitor as well.

An embodiment of the invention provides a pixel structure including a first conductive layer, a semiconductor layer, an insulating layer, a second conductive layer, a passivation layer, and a first electrode layer. The first conductive layer includes a scan line and a bottom electrode. The semiconductor layer includes a first semiconductor pattern, wherein the first semiconductor pattern has a first channel region, a first source region, and a first drain region. The insulating layer is disposed on the semiconductor layer. The second conductive layer is disposed on the insulating layer, and the second conductive layer includes a top electrode, a first gate, a first source, a first drain, and a data line connected to the first source. The bottom electrode and the top electrode overlap to form a capacitor. The passivation layer covers the first conductive layer, the semiconductor layer, and the second conductive layer, wherein the passivation layer has a first opening, a second opening, and a third opening. The first opening exposes the first source and the first source region of the semiconductor layer. The second opening exposes the first drain and the first drain region of the semiconductor layer. The third opening exposes the first gate and the scan line. The first electrode layer is disposed on the passivation layer, and the first electrode layer fills into the first, second and third openings, such that the first source and the first source region are electrically connected to each other, the first drain and first drain region are electrically connected to each other, and the first gate and the scan line are electrically connected to each other.

An embodiment of the invention provides a pixel structure including a scan line, a data line, a first active device, a capacitor, a passivation layer, a first connection structure, a second connection structure, and a third connection structure. The first active device is electrically connected to the scan line and the data line, wherein the first active device includes a first semiconductor pattern, an insulating layer, a first gate, a first source, and a first drain. The first semiconductor pattern has a first channel region, a first source region, and a first drain region. The insulating layer is disposed on the first semiconductor pattern. The first gate, the first source, and the first drain are disposed on the insulating layer. The capacitor is electrically connected to the first active device, and the capacitor includes a bottom electrode and a top electrode. The bottom electrode and the scan line are on the same layer, and the top electrode and the first gate are on the same layer. The passivation layer has a first opening, a second opening, and a third opening. The first connection structure is disposed on the passivation layer to electrically connect the first source and the first source region through the first opening. The second connection structure is disposed on the passivation layer to electrically connect the first drain and the first drain region through the second opening. The third connection structure is disposed on the passivation layer to electrically connect the first gate and the scan line through the third opening.

Based on the above, the first film layer of the pixel structure in an embodiment of the invention is the first conductive layer (for example, a metal layer). Metal layers have a higher reflection rate than that of semiconductor layers, such that the alignment precision can be improved in the subsequent photolithography process. Additionally, the pixel structure mentioned herein utilizes the first conductive layer and the second conductive layer as the electrodes of the pixel capacitor, hence forming a capacitor with a "metal-insulator-metal" arrangement. Such capacitor structure has a much higher stability than that of the conventional "semiconductor-insulator-metal" capacitor structure.

In order to make the features and advantages of the invention more comprehensible, the invention is further described in detail in the following with reference to the embodiments and the accompanying drawings.

DESCRIPTION OF THE EMBODIMENTS

FIG. 1A to FIG. 1E are schematic top views of layers of a pixel structure according to an embodiment of the invention.

FIG. 2A to FIG. 2E are cross-sectional views of a pixel structure according to an embodiment of the invention. The cross-sectional views in FIG. 2A to FIG. 2E correspond to section lines section lines 12-12', section lines 13-13', and section lines 14-14' in FIG. 1A to FIG. 1E, respectively. The manufacturing process of the pixel structure is described in the following embodiment of the invention.

Figure 1A:
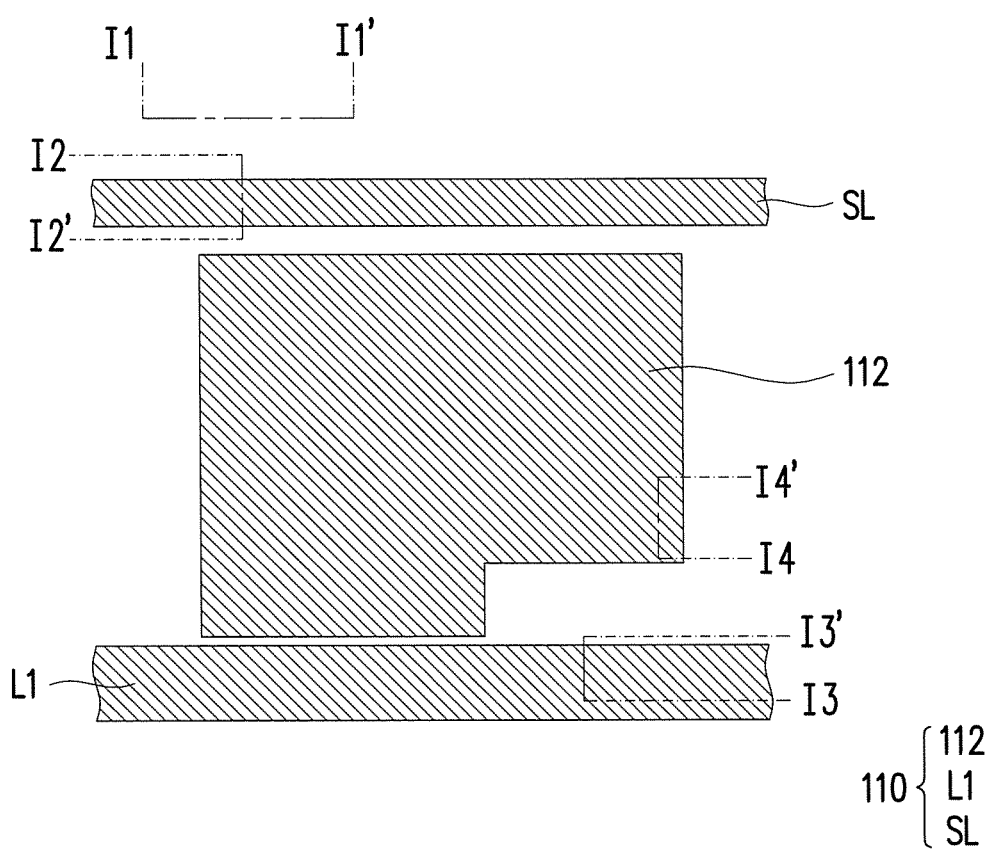
FIG. 1A to FIG. 1E are schematic top views of layers of a pixel structure according to an embodiment of the invention.
Figure 2A:
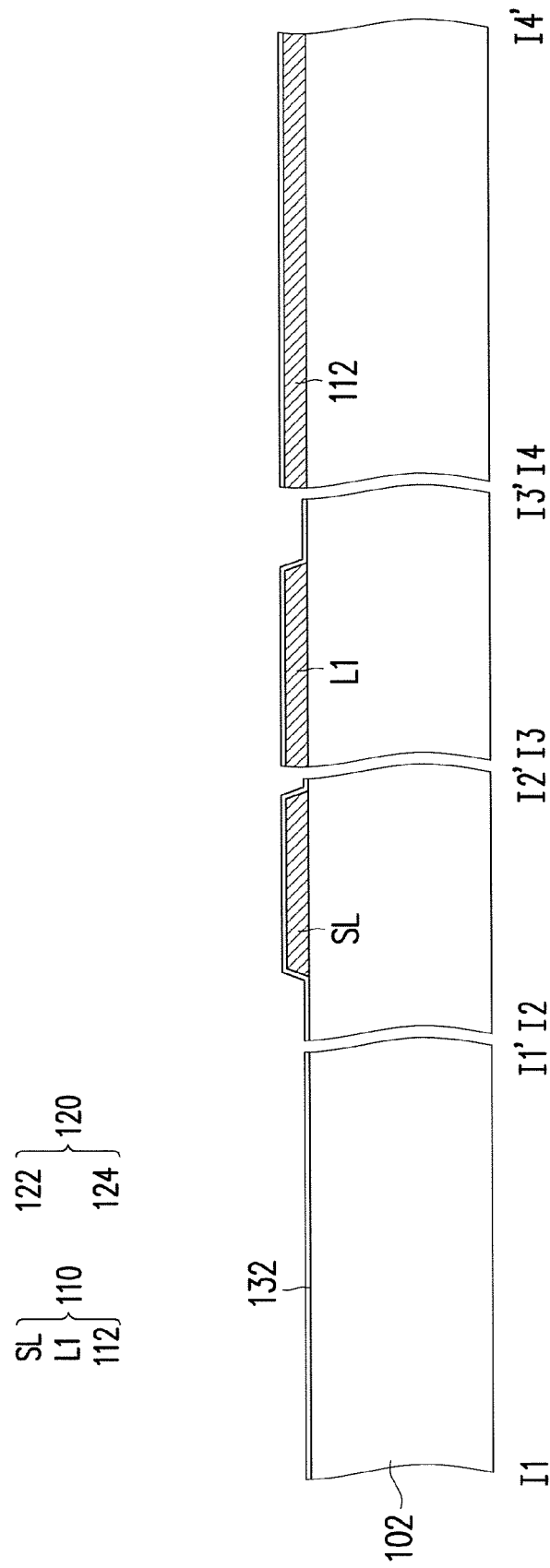
FIG. 2A to FIG. 2E are cross-sectional views of a pixel structure according to an embodiment of the invention.

With reference to FIG. 1A and FIG. 2A, a substrate 102 is provided. The material of the substrate 102 can be glass, quartz, an organic polymer, or an opaque/reflective material (for example, a conductive material, metal, wafers, ceramic or any other suitable materials), or any other suitable materials. If a conductive material or metal is used, an insulating layer (not shown) is disposed on the substrate 102 to avoid the short-circuit problem.

Subsequently, a first conductive layer 110 is formed on a top surface of the substrate 102. The material of the first conductive layer 110 includes metals. The method of forming the first conductive layer 110 is, for example, forming a conductive material layer (not shown) through chemical vapor deposition (CVD) and performing a photolithography and etching process to define patterns, so as to form the first conductive layer 110. The first conductive layer 110 includes a scan line SL, a first signal line L1, and a bottom electrode 112. Thereafter, a first insulating layer 132 is formed on the conductive layer 110, as shown in FIG. 2A. Since the first film layer is a metal layer, the photolithography alignment marker formed by the first film layer has a high reflection rate, which benefits the alignment in the subsequent photolithography process. Compared with the conventional top-gate type pixel structure (having a translucent semiconductor layer as the first film layer), the pixel structure provided in an embodiment of the invention can improve the alignment precision of the subsequent photolithography process.

Figure 1B:
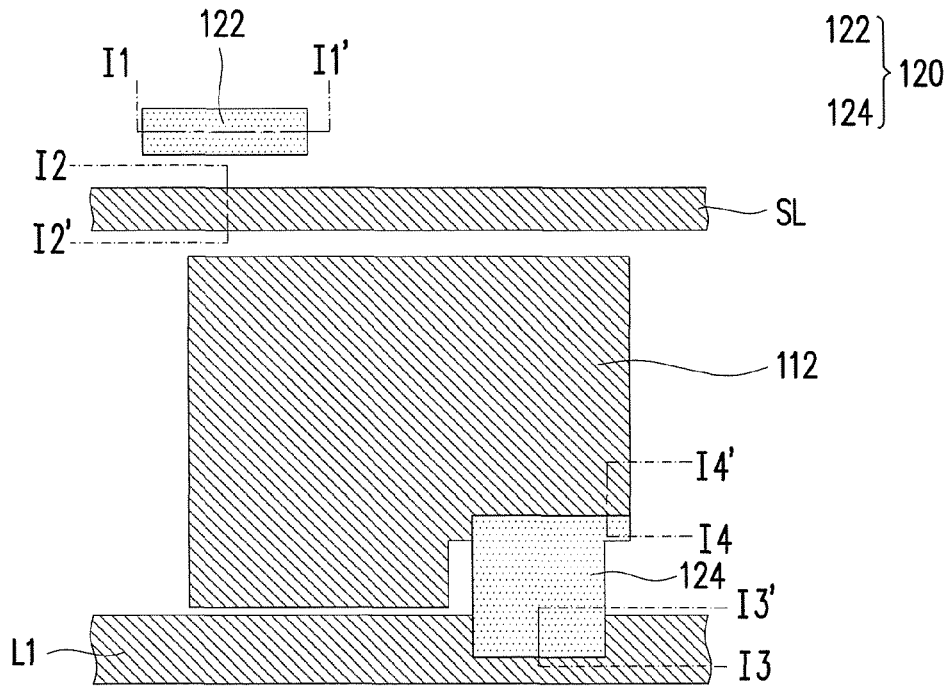

A semiconductor layer 120 is formed on the first insulating layer 132. The method of forming the semiconductor layer 120 is, for example, forming and patterning a semiconductor material (not shown). More specifically, as shown in FIG. 1B, the semiconductor layer 120 has a first semiconductor pattern 122 and a second semiconductor pattern 124. The first semiconductor pattern 122 and the second semiconductor pattern 124 are separated from each other. The semiconductor layer 120 is, for example, made of a metal oxide semiconductor material, such as indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO).

Figure 2B:
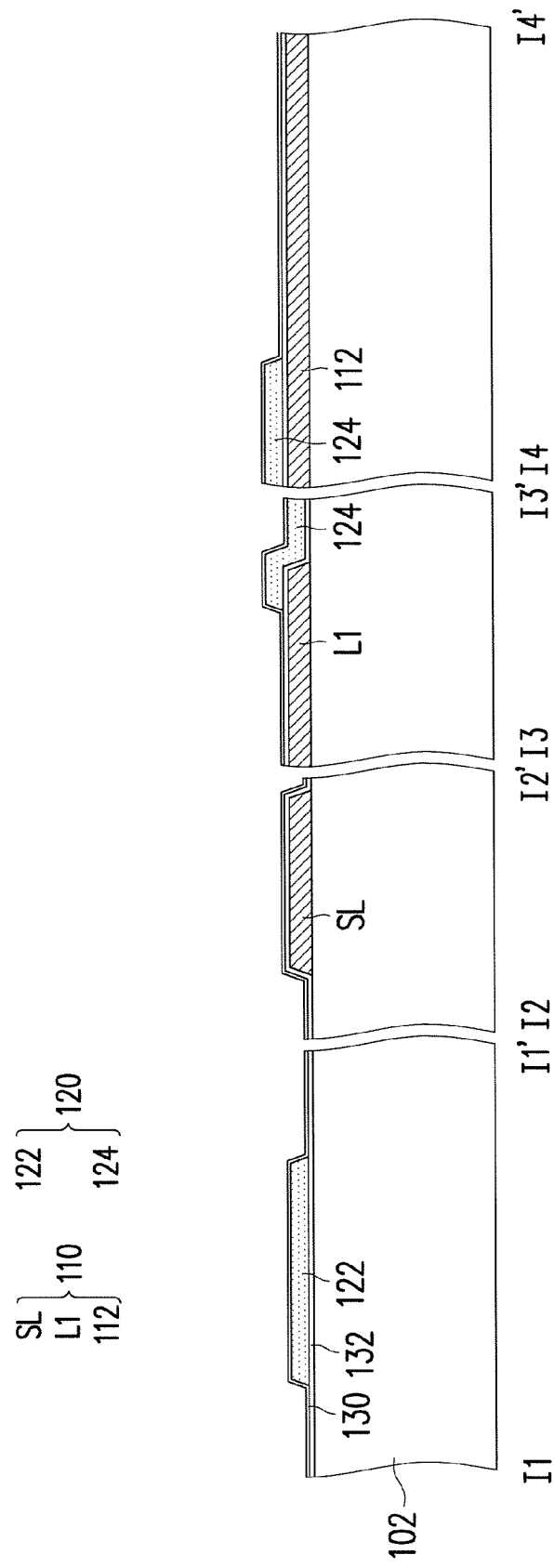

An insulating layer 130 is formed on the semiconductor layer 120, as shown in FIG. 2B. The material of the insulating layer 130 includes an inorganic material (for example, silicon oxide, silicon nitride, silicon oxynitride, any other suitable materials, or stacked layers containing at least two of the above mentioned materials), an organic material, any other suitable material, or the combination of the above.

Figure 1C:
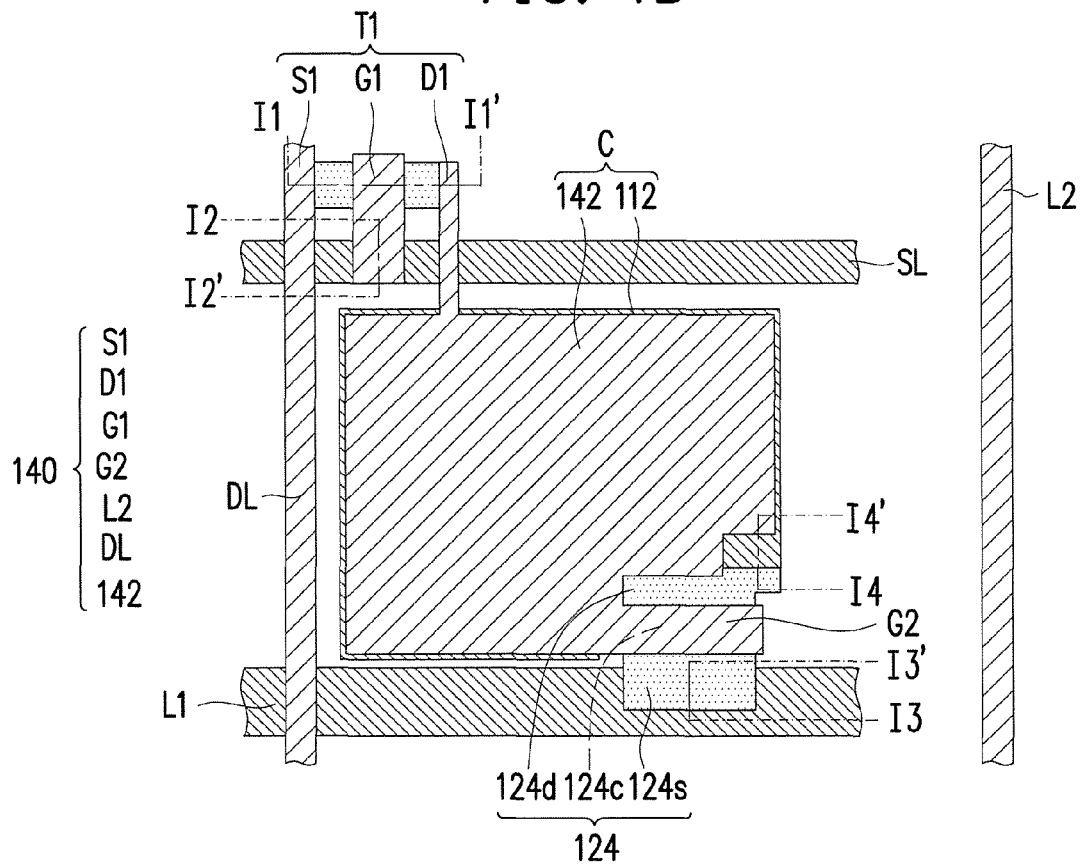
Figure 2C:
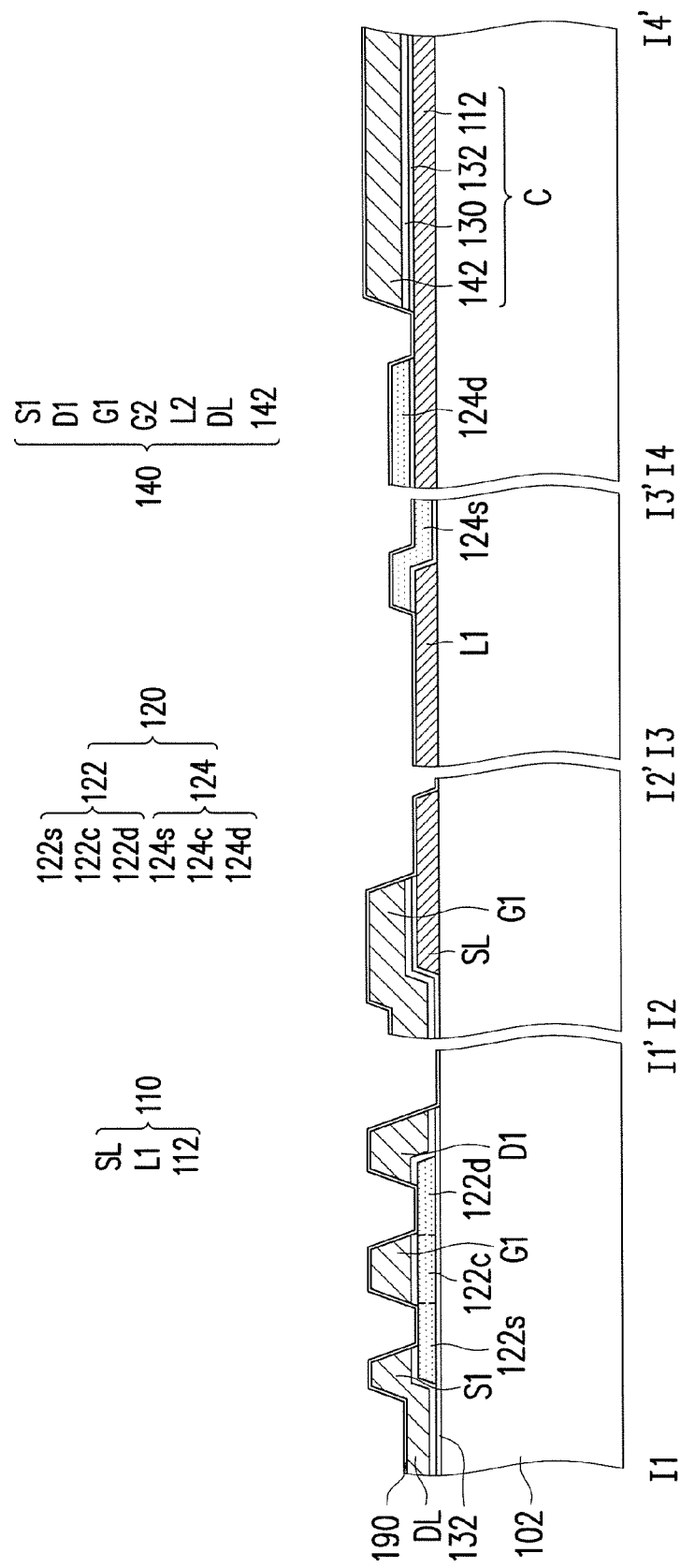

With reference to FIG. 1C and FIG. 2C, a second conductive layer 140 is formed on the insulating layer 130. The material of the second conductive layer 140 includes metals. The second conductive layer 140 includes a first gate G1, a first source S1, a first drain D1, a data line DL, a top electrode 142, a second signal line L2, and a second gate G2. The first source S1 is connected to the data line DL. The first drain D1 is connected to the top electrode 142, while the top electrode 142 is connected to the second gate G2. As mentioned above, as the first gate G1 and the second gate G2 are disposed on the semiconductor layer 120, this type of active device is also called a top-gate type active device. Moreover, the top electrode 142 of the second semiconductor layer 140 overlaps the bottom electrode 112 of the first semiconductor layer 110 to form a capacitor C. Compared to the conventional "semiconductor-insulator-metal" pixel structure, the pixel structure provided in an embodiment of the invention has a "metal-insulator-metal" arrangement. As there is no need to apply a high voltage to the semiconductor layer of the pixel capacitor, the stability of the pixel capacitor can be improved. The method of forming the second conductive layer 140 is, for example, forming a conductive material layer (not shown) on the insulating layer 130 and patterning the conductive material layer, the insulating layer 130, and the first insulating layer 132 simultaneously.

According to an embodiment, after forming the second conductive layer 140, an aluminum layer (not shown) is formed on the patterned insulating layer 130 and the second conductive layer 140. Subsequently, the aluminum layer is placed in an oxygen atmosphere for thermal annealing, and thereby the aluminum layer is oxidized to form an aluminum oxide ($Al_2O_3$) layer 190. During the thermal annealing process, in the contact region of the aluminum layer and the semiconductor layer 120, the aluminum atoms react with the semiconductor layer 120 and increase the conductivity of this region, and thereby a first source region 122s, a first drain region 122d, a second source region 124s, and a second drain region 124d are formed. Hence, the first semiconductor pattern 122 includes a first channel region 122c, a first source region 122s, and a first drain region 122d. The second semiconductor pattern 124 includes a second channel region 124c, a second source region 124s, and a second drain region 124d. Additionally, the aluminum oxide layer 190 formed in those regions of the aluminum layer which are not in contact with the semiconductor layer 120 can serve as an insulating layer.

Figure 1D:
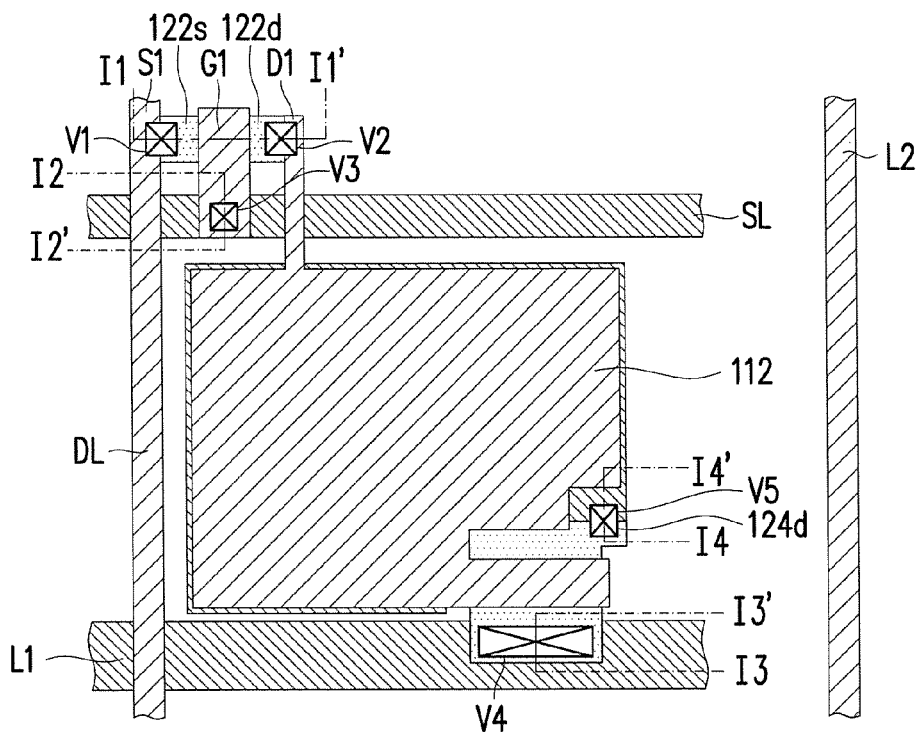
Figure 2D:
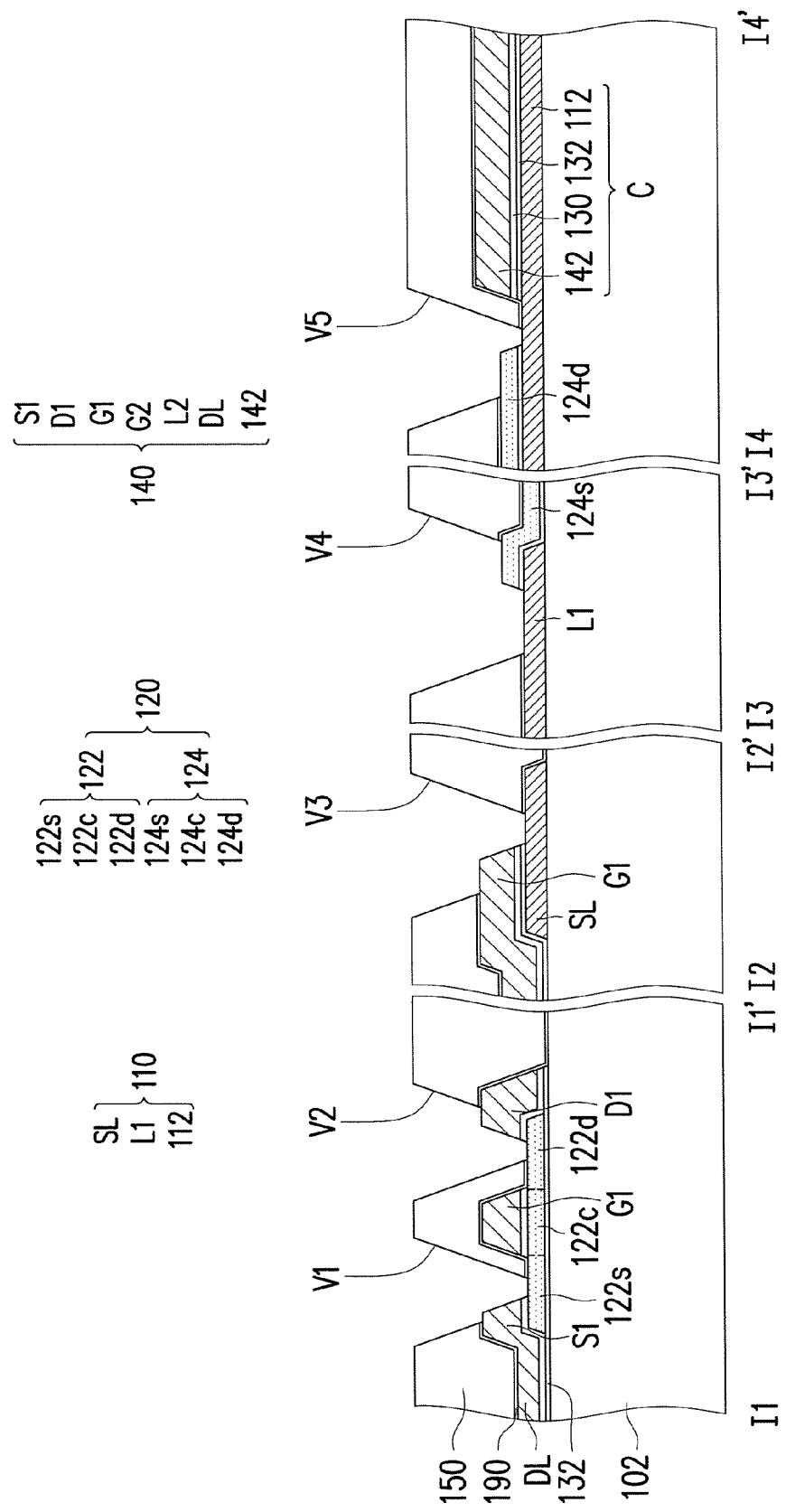

With reference to FIG. 1D and FIG. 2D, a passivation layer 150 is formed on the second conductive layer 140 and the aluminum oxide layer 190. The passivation layer 150 covers the first conductive layer 110, the second conductive layer 140, and the semiconductor layer 120. The passivation layer 150 has a first opening V1, a second opening V2, a third opening V3, a fourth opening V4, and a fifth opening V5. The first opening V1 exposes the first source S1 and the first source region 122s of the first semiconductor pattern 122. The second opening V2 exposes the first drain D1 and the first drain region 122d of the first semiconductor pattern 122. The third opening V3 exposes the first gate G1 and the scan line SL. The fourth opening V4 exposes the second source region 124s and the first signal line L1. The fifth opening V5 exposes the second drain region 124d of the second semiconductor pattern 124 and the bottom electrode 112. The method of forming the passivation layer 150 includes forming and patterning a passivation material layer (not shown). It is worth mentioning that when patterning the passivation material layer, the underlying aluminum oxide layer 190 is also removed, such that the semiconductor layer 120, the first conductive layer 110, and the second conductive layer 140 can be exposed. In other words, the passivation layer 150 and the aluminum oxide layer 190 use the same photomask in the manufacturing process. Since patterns on the passivation layer 150 and the aluminum oxide layer 190 are simultaneously defined, one photomask may be omitted in the manufacturing process, and thus the production of the production line may be increased.

Figure 1E:
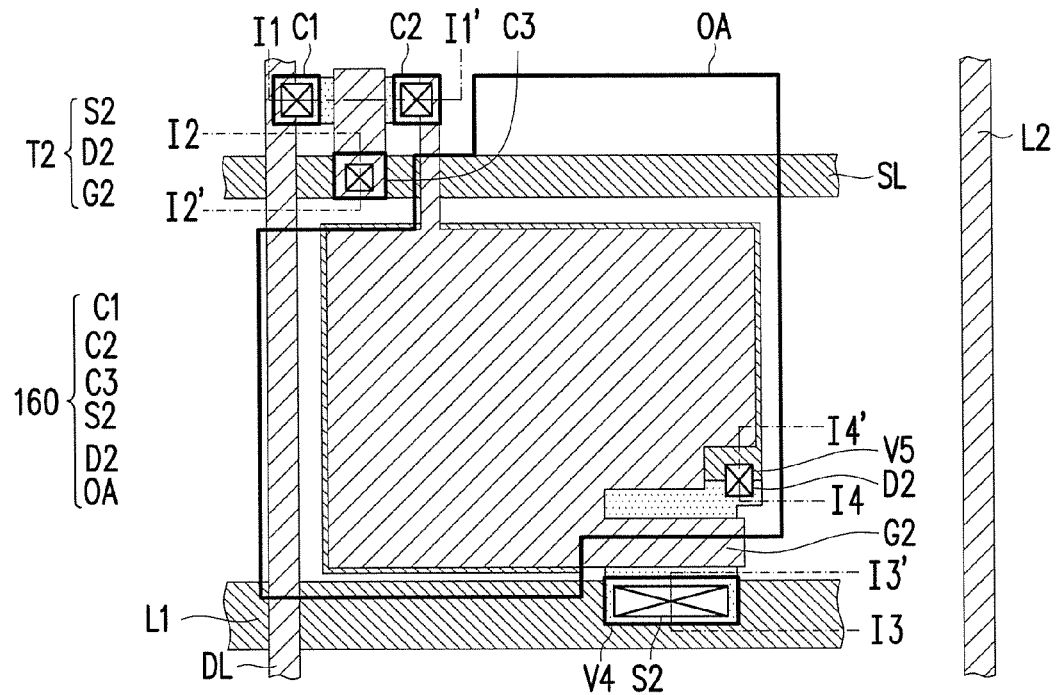
Figure 2E:
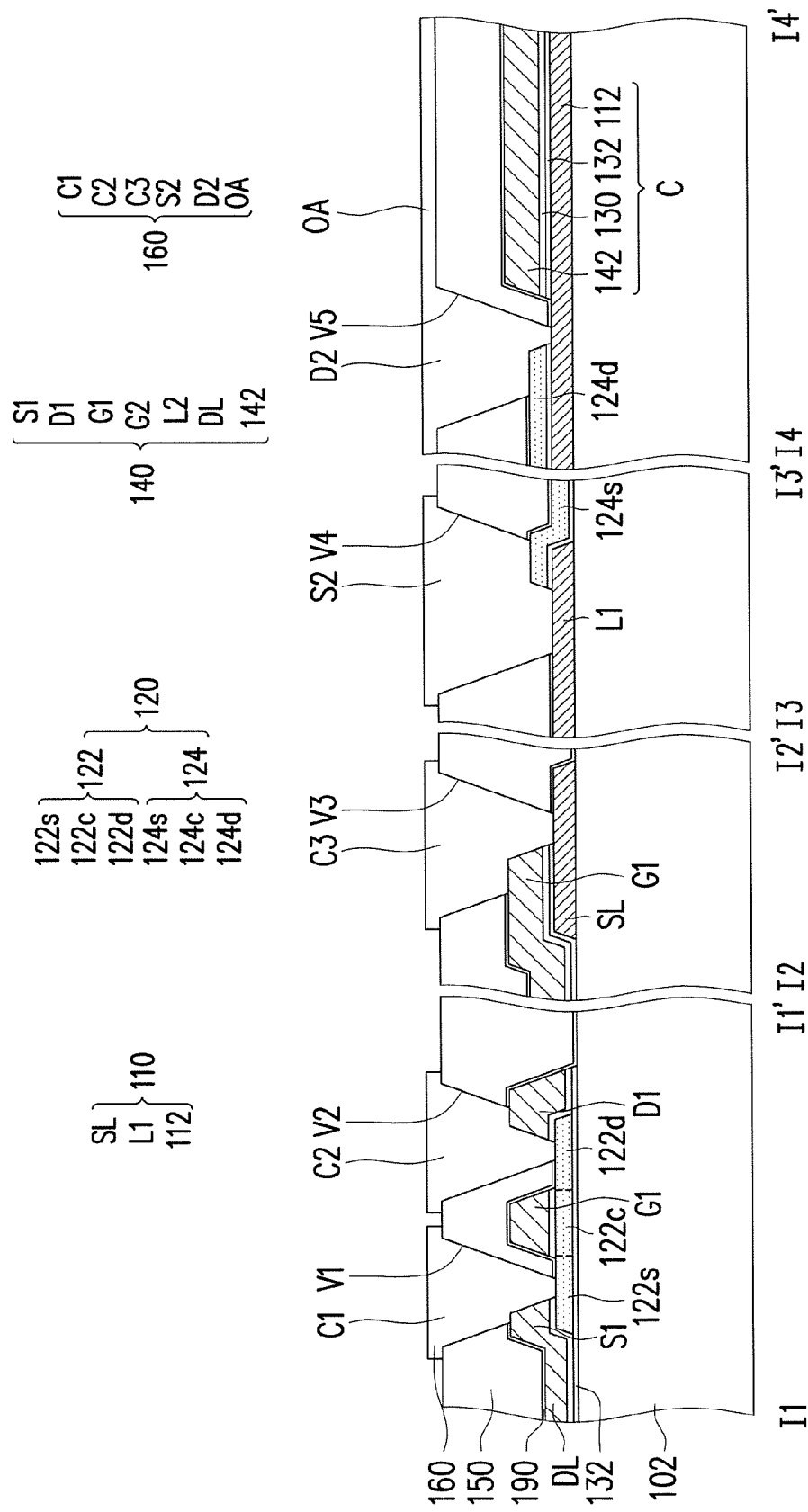

With reference to FIG. 1E and FIG. 2E, a first electrode layer 160 is formed on the passivation layer 150. The first electrode layer 160 fills into the first opening V1, the second opening V2, the third opening V3, the fourth opening V4, and the fifth opening V5. The method of forming the first electrode layer 160 is, for example, forming an electrode material layer (not shown) and patterning this layer to define a first connection structure C1, a second connection structure C2, a third connection structure C3, a second source S2, a second drain D2, and a first electrode OA. More specifically, the first connection structure C1 of the first electrode layer 160 fills into the first opening V1, such that the first source S1 and the first source region 122s are electrically connected to each other. The second connection structure C2 of the first electrode layer 160 fills into the second opening V2, such that the first drain D1 and the first drain region 122d are electrically connected to each other. The third connection structure C3 of the first electrode layer 160 fills into the third opening V3, such that the first gate G1 and the scan line SL are electrically connected to each other. The second source S2 of the first electrode layer 160 fills into the fourth opening V4 to electrically connect the first signal line L1. The second drain D2 of the first electrode layer 160 fills into the fifth opening V5, and is electrically connected to the second drain region 124d and the bottom electrode 112. The second drain D2 and the first electrode OA are connected to each other, and thus the first electrode OA is electrically connected to the second drain region 124d and the bottom electrode 112 through the second drain D2.

In the pixel structure described above, the first electrode OA of the first electrode layer 160 overlaps the scan line SL and the data line DL. Therefore, an area of the first electrode OA is increased, which subsequently increases the area of the light emitting region in the pixel structure.

Figure 2F:
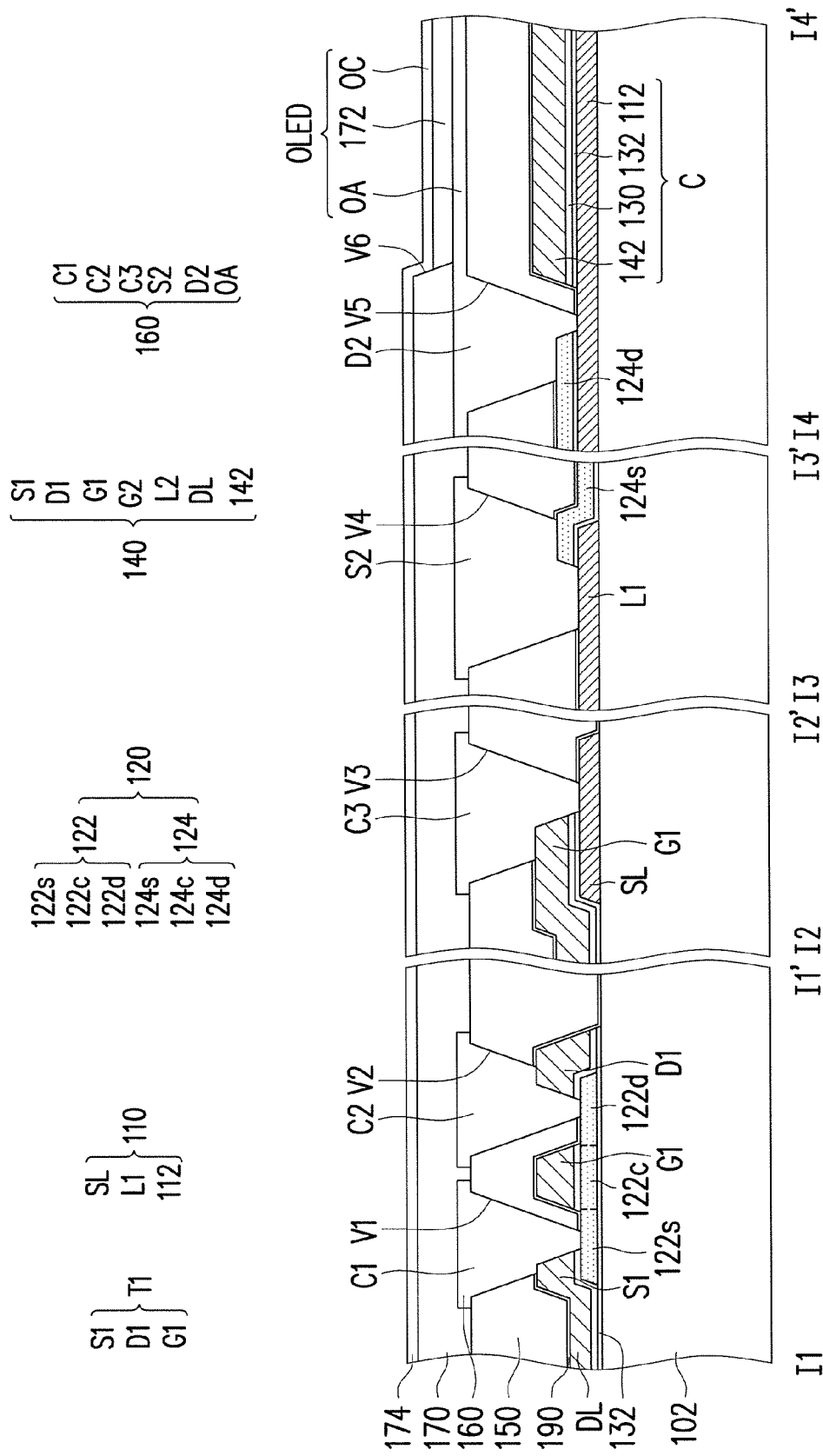
FIG. 2F is a schematic cross-sectional view of a pixel structure in an OLED display panel according to an embodiment of the invention.

If the above pixel structure is applied in an OLED display panel, after performing the step shown in FIG. 2E, the step in FIG. 2F is further performed. This means forming a second insulating layer 170 on the first electrode layer 160, and the second insulating layer 170 has a sixth opening V6 that exposes the first electrode OA. A light emitting layer 172 is then formed at the sixth opening V6, and the light emitting layer 172 can be a red organic light emitting pattern, a green organic light emitting pattern, a blue organic light emitting pattern, or a light emitting pattern in different colors (for example, white, orange, purple, etc.) generated by mixing different spectrum of light. A second electrode layer 174 then covers the light emitting layer 172, wherein the second electrode layer 174 has a second electrode OC, and the second electrode OC is electrically connected to a second signal line L2. Here, the first electrode OA, the light emitting layer 172, and the second electrode OC together constitute an organic light-emitting diode OLED.

Figure 3:
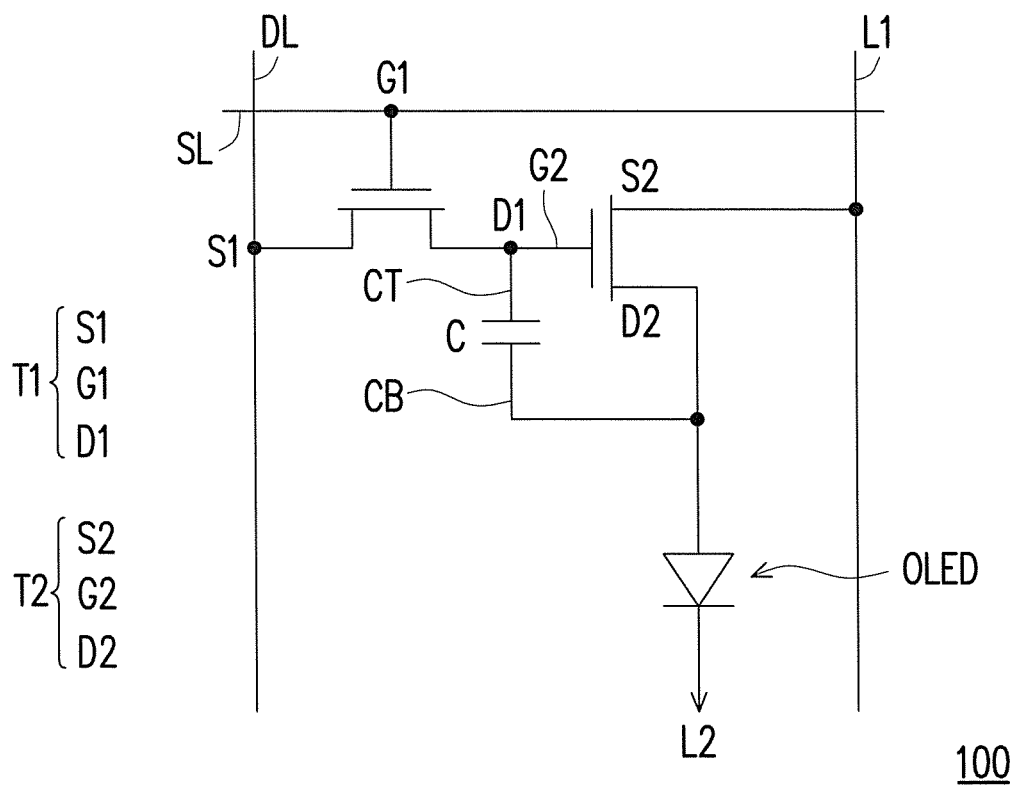
FIG. 3 is an equivalent circuit diagram of a pixel structure in an OLED display panel according to an embodiment of the invention.

FIG. 3 is an equivalent circuit diagram of a pixel structure in an OLED display panel according to an embodiment of the invention. Here, a 2T1C pixel structure is used as an example, where the pixel structure 100 includes a first active device T1, a second active device T2, and a capacitor C. The pixel structure 100 includes a scan line SL, a data line DL, a first active device T1, a second active device T2, a capacitor C, an organic light emitting diode OLED, a first signal line L1, and a second signal line L2. The first active devices T1 and T2 are, for example, top-gate type thin film transistors. The first active device T1 includes a first gate G1, a first source S1, and a first drain D1. The second active device T2 includes a second gate G2, a second source S2, and a second drain D2. The first gate G1 is coupled to the scan line SL. The first source S1 is coupled to the data line DL. The first drain D1 is coupled to the second gate G2 and also coupled to the top electrode CT of the capacitor C. The second source S2 is coupled to the first signal line L1. The second drain D2 is coupled to the anode of the organic light emitting diode OLED and also coupled to the bottom electrode CB of the capacitor C. The cathode of the organic light emitting diode OLED is coupled to the second signal line L2.

As mentioned above, the first electrode OA of the first electrode layer 160 can overlap the scan line SL and data line DL to increase an area of the light emitting region of the pixel structure. In general, the ratio of an area of the light emitting region in the pixel structure to an area of the entire pixel is known as the aperture ratio. According to the present embodiment, the first electrode layer 160 overlaps the scan line SL and data line DL, which is conducive to an increase in the aperture ratio.

In summary, the first film layer of the pixel structure in an embodiment of the invention is the first conductive layer (a metal layer). As compared to the semiconductor layer, the metal layer has a higher reflection rate and can thus improve the alignment precision of the subsequent photolithography process. Additionally, the first conductive layer and the second conductive layer serve as the electrodes of the pixel capacitor. The conventional "semiconductor-insulator-metal" pixel capacitor structures requires a high voltage to increase the conductivity of the semiconductor layer. However, applying a high voltage over a long period of time is likely to affect the properties of the pixel capacitor, hence affecting the overall display uniformity of the pixels on the panel. In comparison, the "metal-insulator-metal" pixel capacitor structure provided in an embodiment of the invention is more stable than conventional "semiconductor-insulator-metal" type pixel capacitor structure. Moreover, the passivation layer 150 of the pixel structure in an embodiment of the invention has the first opening V1 and the second opening V2 that expose the second conductive layer 140 and the semiconductor layer 120. The third opening V3 of the passivation layer 150 exposes the first conductive layer 110 and the second conductive layer 140. The fourth opening V4 of the passivation layer 150 exposes the semiconductor layer 120 and the first conductive layer 110. The fifth opening V5 of the passivation layer 150 exposes the semiconductor layer 120 and the first conductive layer 110. Subsequently, the first electrode layer 160 is bridged between the semiconductor layer 120 and the first conductive layer 110, between the first conductive layer 110 and the second conductive layer 140, and between the semiconductor layer 120 and the second conductive layer 140. Therefore, the design of the pixel structure provided in an embodiment of the invention can reduce the required number of photomasks. Moreover, the first electrode layer 160 can overlap the scan line SL and data line DL, which is beneficial for the high aperture ratio design of the pixel structure. Overall, the pixel structure provided in an embodiment of the invention can improve the alignment precision in the photolithography process, improve the stability of the pixel capacitor, maintain a high aperture ratio while reducing the use of one photomask, and increase the volume of production.

Although the embodiments have been disclosed in the invention as shown above, the embodiments are not used to limit the invention. It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A pixel structure comprising:
a first conductive layer comprising a scan line and a bottom electrode;

a semiconductor layer comprising a first semiconductor pattern, wherein the first semiconductor pattern has a first channel region, a first source region, and a first drain region;

a first insulating layer disposed between the first conductive layer and the semiconductor layer;

a second insulating layer disposed on the semiconductor layer;

a second conductive layer disposed on the second insulating layer, wherein the second conductive layer comprises a top electrode, a first gate, a first source, a first drain, and a data line connected to the first source, wherein the bottom electrode and the top electrode overlap to form a capacitor;

a passivation layer covering the first conductive layer, the semiconductor layer, and the second conductive layer, wherein the passivation layer has a first opening, a second opening, and a third opening, the first opening exposes the first source and the first source region of the semiconductor layer, the second opening exposes the first drain and the first drain region of the semiconductor layer, and the third opening exposes the first gate and the scan line; and a first electrode layer disposed on the passivation layer, wherein the first electrode layer fills into the first opening, the second opening, and the third opening, such that the first source and the first source region are electrically connected to each other, the first drain and the first drain region are electrically connected to each other, and the first gate and the scan line are electrically connected to each other.

2. The pixel structure according to claim 1, wherein the first electrode layer overlaps the scan line and the data line.

3. The pixel structure according to claim 1,
the first conductive layer further comprising a first signal line;
the semiconductor layer further comprising a second semiconductor pattern, and the second semiconductor pattern has a second channel region, a second source region, and a second drain region;
the second conductive layer further comprising a second gate and a second signal line;
the passivation layer further comprising a fourth opening and a fifth opening, the fourth opening exposing the second source region and the first signal line, the fifth opening exposing the second drain region and the bottom electrode; and
the first electrode layer further comprising a second source, the second source filling into the fourth opening to electrically connect the second source region, the first electrode layer further comprising a second drain, the second drain filling into the fifth opening to electrically connect the second drain region.

4. The pixel structure according to claim 3, further comprising:
a light emitting layer disposed on the first electrode layer; and
a second electrode layer disposed on the light emitting layer, wherein the second electrode layer and the second signal line are electrically connected to each other.

5. The pixel structure according to claim 1, wherein the first electrode layer comprises:
a first connection structure disposed on the passivation layer to electrically connect the first source and the first source region through the first opening;
a second connection structure disposed on the passivation layer to electrically connect the first drain and the first drain region through the second opening; and
a third connection structure disposed on the passivation layer to electrically connect the first gate and the scan line through the third opening.

6. The pixel structure according to claim 1, wherein the semiconductor layer comprises a metal oxide semiconductor material.

7. The pixel structure according to claim 1, further comprising an aluminum oxide layer disposed on a surface of the second conductive layer.

8. A pixel structure comprising:
a scan line and a data line;
a first active device electrically connected to the scan line and the data line, the first active device comprising:
a first semiconductor pattern having a first channel region, a first source region, and a first drain region;
an insulating layer, disposed on the first semiconductor pattern; and
a first gate, a first source, and a first drain all disposed on the insulating layer;
a capacitor electrically connected to the first active device, the capacitor comprising a bottom electrode and a top electrode, wherein the bottom electrode and the scan line are in a same layer, and the top electrode and the first gate are in a same layer;
a passivation layer having a first opening, a second opening, and a third opening;
a first connection structure disposed on the passivation layer to electrically connect the first source and the first source region through the first opening;
a second connection structure disposed on the passivation layer to electrically connect the first drain and the first drain region; and
a third connection structure disposed on the passivation layer to electrically connect the first gate and the scan line.

9. The pixel structure according to claim 8, further comprising:
a second active device comprising:
a second semiconductor pattern having a second channel region,
a second source region, and a second drain region, the insulating layer covering the second semiconductor pattern;
a second gate, a second source, and a second drain all disposed on the insulating layer;
a first signal line disposed below the insulating layer;
a second signal line disposed on the insulating layer;
the passivation layer covering the first signal line and the second signal line and further comprising a fourth opening and a fifth opening, wherein the second source electrically connects the second source region and the first signal line through the fourth opening, and the second drain electrically connects the second drain region and the bottom electrode through the fifth opening.

10. The pixel structure according to claim 8, further comprising:
a first electrode disposed on the passivation layer and connected to the second drain;
a light emitting layer disposed on the first electrode; and
a second electrode disposed on the light emitting layer.

11. The pixel structure according to claim 10, wherein the first electrode overlaps the scan line and the data line.

12. The pixel structure according to claim 8, wherein the semiconductor layer comprises a metal oxide semiconductor material.

13. The pixel structure according to claim 8 further comprising an aluminum oxide layer disposed on a surface of the first gate, a surface of the first source, a surface of the first drain, and a surface of the top electrode.

\* \* \* \* \*